(12) United States Patent
Cakebread

(10) Patent No.: US 11,199,427 B2
(45) Date of Patent: Dec. 14, 2021

(54) ENCLOSURE ASSEMBLY AND METERING APPARATUS COMPRISING SAME

(71) Applicant: Landis+Gyr AG, Zug (CH)

(72) Inventor: Andrew Cakebread, Peterborough (GB)

(73) Assignee: Landis+Gyr AG, Cham (CH)

( * ) Notice: Subject to any disclaimer, the term of this patent is extended or adjusted under 35 U.S.C. 154(b) by 258 days.

(21) Appl. No.: 16/477,520

(22) PCT Filed: Jan. 11, 2018

(86) PCT No.: PCT/IB2018/050177
§ 371 (c)(1),
(2) Date: Jul. 11, 2019

(87) PCT Pub. No.: WO2018/130965
PCT Pub. Date: Jul. 19, 2018

(65) Prior Publication Data
US 2020/0191615 A1 Jun. 18, 2020

(30) Foreign Application Priority Data
Jan. 12, 2017 (SE) ...................................... 00039/17

(51) Int. Cl.
*G01D 4/02* (2006.01)
*G01D 11/24* (2006.01)

(52) U.S. Cl.
CPC ............. *G01D 11/245* (2013.01); *G01D 4/02* (2013.01)

(58) Field of Classification Search
CPC ............................... G01D 11/245; G01D 4/02
See application file for complete search history.

(56) References Cited

U.S. PATENT DOCUMENTS

| 8,704,509 B2 | 4/2014 | Neal et al. |
| 2013/0027855 A1 | 1/2013 | Ko |
| 2013/0149028 A1 | 6/2013 | Bollenbach |

FOREIGN PATENT DOCUMENTS

| CN | 103119236 A | 5/2013 |
| CN | 103442539 A | 12/2013 |

(Continued)

OTHER PUBLICATIONS

International Search Report and Written Opinion, PCT Application No. PCT/IB2018/050177, dated Jun. 22, 2018.

(Continued)

*Primary Examiner* — Jamel E Williams
(74) *Attorney, Agent, or Firm* — Kilpatrick Townsend & Stockton LLP

(57) ABSTRACT

An enclosure assembly includes a first enclosure portion and a second enclosure portion which in a fully assembled state of the enclosure assembly enclose at least a part of an inner space for accommodating a metering device; and a fixation arrangement for affixing the first enclosure portion to the second enclosure portion in the fully assembled state, wherein the fixation arrangement in a fixation position prevents the first enclosure portion and the second enclosure portion from being separated from each other. The fixation arrangement includes at least one latching element arranged at the first enclosure portion and at least one counter latching element arranged at the second enclosure portion. In the fixation position, the at least one latching element is in engagement with the at least one counter latching element, and a blocking element prevents a disengagement of the at least one latching element and the at least one counter latching element.

13 Claims, 4 Drawing Sheets

(56) References Cited

FOREIGN PATENT DOCUMENTS

| CN | 107667572 A | 2/2018 | | |
|---|---|---|---|---|
| DE | 2715861 A1 | 10/1978 | | |
| DE | 20 2004 017069 U1 | 2/2005 | | |
| DE | 202004017069 U1 | * | 2/2005 | ........... G01R 22/065 |
| DE | 10 2010 033962 A1 | 2/2012 | | |
| DE | 102010033962 A1 | * | 2/2012 | ........... G01D 11/245 |
| EP | 1593974 B1 | 8/2007 | | |
| EP | 2 762 899 A1 | 8/2014 | | |
| EP | 2762899 A1 | * | 8/2014 | ............ G01R 11/04 |
| GB | 2159633 A | 12/1985 | | |
| RU | 2415503 C1 | 3/2011 | | |
| WO | 2008/119651 A1 | 10/2008 | | |
| WO | 2016/202692 A1 | 12/2016 | | |
| WO | WO-2016202692 A1 | * | 12/2016 | ............. G01R 11/24 |

OTHER PUBLICATIONS

Written Opinion of the International Preliminary Examining Authority, PCT Application No. PCT/IB2018/050177, dated Dec. 7, 2018.
International Preliminary Report on Patentability, PCT Application No. PCT/IB2018/050177, dated Mar. 29, 2019.
Office Action, Indian Patent Application No. 201947031528, Sep. 10, 2021, 6 pages.
Decision on Grant and Search Report, Russian Patent Application No. 20190125250, May 18, 2021, 20 pages.
Office Action with Search Report, Chinese Patent Application No. 201880018214.8, Apr. 7, 2021, 17 pages.

* cited by examiner

ENCLOSURE ASSEMBLY AND METERING APPARATUS COMPRISING SAME

The present disclosure relates to an enclosure assembly, in particular for an enclosure of a metering apparatus, comprising a first enclosure portion and a second enclosure portion which are configured to be assembled by being moved towards each other along an assembly direction, and in a fully assembled state of the enclosure assembly enclose at least a part of an inner space for accommodating a metering device; and a fixation arrangement for affixing the first enclosure portion to the second enclosure portion in the fully assembled state, wherein the fixation arrangement in a fixation position prevents the first enclosure portion and the second enclosure portion from being separated from each other;

wherein the fixation arrangement comprises at least one latching element arranged at the first enclosure portion and at least one counter latching element arranged at the second enclosure portion;

wherein a latching nose is arranged at a free end of the at least one latching element and protrudes from the at least one latching element in a latching direction running perpendicularly to the assembly direction; and wherein in the fixation position, the at least one latching element is in engagement with the at least one counter latching element, and a blocking element prevents a disengagement of the at least one latching element and the at least one counter latching element.

Furthermore, the present disclosure relates to a metering apparatus comprising a metering device accommodated within an enclosure assembly.

BACKGROUND

Enclosure assemblies and metering apparatuses as described above are known from the prior art. The metering apparatuses comprise metering devices for metering a utility, such as gas, electricity, water, or alike. The enclosure assembly is commonly used to surround the metering device in order to protect it against harmful environmental impacts, such as dirt or moisture, as well as against tampering attempts by unauthorised individuals.

For example, DE 20 2004 017069 U1 describes an electricity meter with a housing, the housing having a box-shaped lower part and a lid. The lower part comprises a locking protrusion and a ledge, both having ramp-shaped surfaces facing each other. The lid is provided legs each having a locking opening. In a locking position, the locking part is arranged between the locking protrusion and the ledge, while the locking protrusion extends through the locking opening and a projection formed at the legs is jammed between the ramp-shaped surface and a respective side wall of the housing.

DE 10 2010 033962 A1 describes a housing having an upper housing portion and a lower housing portion which are detachably connected by using fasteners. An intermediate plate in lower housing portion, comprises several chambers and is connected with the lower housing portion by retaining clips which are used for fixing shunt components.

WO 2016/202692 A1 filed by the applicant of the present disclosure relates to a housing for a device. The housing comprises a first housing part and a second housing part, which are joined together in a closed state of the housing. The housing parts each have at least one holding apparatus for holding a closure element which, in the closed state, extends along the at least one holding apparatus of both housing parts, at least in sections. The holding apparatuses, and the closure element are designed such that the closure element interlockingly engages in a wall of the respective holding apparatus of both housing parts.

According to the prior art, the fixation arrangement comprises screws, rivets, and additional parts for affixing the first enclosure portion to the second enclosure portion in the fully assembled state. Additionally, a mechanical seal may be used for indicating that the enclosure has been assembled or closed around the metering device by authorised personnel. A broken seal may indicate a tampering attempt, or at least that an unauthorised individual attempted to open the enclosure.

These kind of fixation arrangements according to the prior art have several drawbacks. Firstly, using screws, rivets, and additional parts for affixing the first enclosure portion to the second enclosure portion in the fully assembled state, can be cumbersome and time-consuming. Secondly, even if the mechanical seal is broken, it may have been repaired or seemingly restored in a way that it appears to be intact and thus, the tampering event may be overlooked.

SUMMARY

It is an objective of this invention to provide an enclosure assembly and metering apparatus, which overcome at least some of the drawbacks occurring according to the prior art as described above.

According to the present invention, these objectives are at least partially achieved through the features of an enclosure assembly as defined in independent claim 1. For a metering apparatus, these objectives are at least partially achieved in that the metering apparatus comprises an enclosure assembly according to the present invention.

According to the present invention, the above-mentioned objectives are particularly achieved in that in a deflected position of the at least one latching element, the latching nose abuts the at least one counter latching element in the latching direction, and the blocking element abuts the at least one latching element in a deflection direction running perpendicularly to the latching direction.

In other words, when the at least one latching element is deflected by the at least one counter latching element while transferring the first enclosure portion and the second enclosure portion from a pre-assembled state to the fully assembled state, the at least one latching element is additionally deflected by the blocking element. Therefore, the at least one latching element is deflectable, i.e. elastically deformable, both along the latching direction and the deflection direction.

Upon joining the first enclosure portion with the second enclosure portion along the assembly direction, the free end may be deflected so that the latching nose can pass the counter latching element and afterwards snap in behind the counter latching element in order to affix the first enclosure portion to the second enclosure portion. A deflection of the latching nose is facilitated in that the free end is formed at the latching arm, a root or base section of which is arranged at the first enclosure portion or the second enclosure portion, respectively.

This solution has the advantage over the prior art that when the first enclosure portion and the second enclosure portion are joined by being moved towards each other in the assembly direction, the at least one latching element and the at least one counter latching element may automatically snap into engagement with each other upon reaching the fully assembled state. At the same time or in an additional step, the at least one latching element and the at least one counter latching element are blocked in the fixation position, so that their disengagement is prevented.

Any number of latching elements and corresponding counter latching elements can be used depending on a size and geometry of an enclosure. The first enclosure portion and the second enclosure portion may be designed as top part or bottom part, respectively, of the enclosure, as required. Latching elements and counter latching element may be provided at the first enclosure portion and/or the second enclosure portion as desired for affixing the portions to each other in the fully assembled state at the latest. The first enclosure portion and the at least one latching element and the second enclosure portion and the at least one counter latching element as well as the blocking element may be integrally formed of synthetic materials, respectively, for example by injection moulding.

Thereby, an enclosure assembly according to the present invention enables the first enclosure portion and the second enclosure portion to be locked together with a single assembly motion. No additional parts, like screws or rivets, or special tools for operating the additional parts are required. This helps in minimising steps for assembling an enclosure and thus a metering apparatus according to the present invention. Furthermore, by being blocked in the fixation position by means of the blocking element, a fixation arrangement according to the present invention allows for securely affixing the first enclosure portion and the second enclosure portion to each other in a manner that tampering with the metering apparatus is prevented or at least made very difficult without destroying or damaging the enclosure.

The inventive solution may be combined and improved by the following further embodiments, which are each advantageous on their own.

In a first further embodiment, the at least one latching element comprises a latching arm extending away from the first enclosure portion along the assembly direction. Upon joining the first enclosure portion and the second enclosure portion in the assembly direction, the latching arm may reach into the respective other portion in order to be accommodated therein. By reaching into the respective other portion, the latching arm may help to guide the first enclosure portion and/or the second enclosure portion when being moved towards each other along the assembly direction in order to properly and securely reach the fully assembled state.

In some embodiments, in the fixation position, the at least one latching element is positioned between the at least one counter latching element and the blocking element. Thereby, the at least one latching element and/or the at least one counter latching element may be immobilised or at least a movement thereof inhibited in such a way that they are blocked in the fixation position. Furthermore, positioning the at least one latching element between the at least one counter latching element and the blocking element helps in providing an enclosure assembly according to the present invention with a compact design.

In some embodiments, the counter latching element is formed as a detent jutting out in a direction opposite to the latching direction. Forming the counter latching element as a detent helps to provide holding sufficient surfaces for taking up forces acting between the at least one latching element and the at least one counter latching element, which forces may cause a separation of the first enclosure portion and the second enclosure portion along the assembly direction. Forming the counter latching element as a detent also helps in enabling an automatic engagement of the at least one latching element with the at least one counter latching element when reaching the fully assembled state, for example in that the at least one latching element snaps in behind the at least one counter latching element in the assembly direction.

In some embodiments, the blocking element is located behind the at least one latching element the fixation position on an opposite side of the at least one latching element as the at least one counter latching element. When passing the at least one counter latching element, the at least one latching element may be deflected in a direction opposite to the latching direction such that when releasing the deflection, the at least one latching element may snap into a latched position, where it is in engagement with the at least one counter latching element. In the alternative, the at least one counter latching element may be deflected in the latching direction such that it may snap into a latched position. In either way, locating the blocking element behind the at least one latching element on the other side thereof as where the at least one counter latching element is located, helps in supporting the at least one latching element in a direction opposite to the latching direction and thereby enables to take up forces which may cause a disengagement of the at least one latching element and the at least one counter latching element.

In some embodiments, the at least one counter latching element and the blocking element are arranged essentially at the same height measured in parallel to the assembly direction. Upon reaching the fully assembled state, the at least one latching element may thereby snap back by its inherent spring forces, both in a direction opposite to the latching direction and a direction opposite to the deflection direction, such that it slides behind the at least one counter latching element in the assembly direction and along the blocking element in a direction opposite to the deflection direction, respectively. Thereby, the at least one latching element can be automatically blocked in the fixation position by means of the blocking element.

In some embodiments, the blocking element is formed as a notch with a lead-in chamfer at least partially facing in a direction opposite to the assembly direction. The lead-in chamfer helps in guiding the at least one latching element along the blocking element when joining the first enclosure portion and the second enclosure portion by moving them towards each other along the assembly direction. In particular, the lead-chamfer enables a smooth and reliable deflection of the at least one latching element in the deflection direction during the assembly of the enclosure assembly. During the joining of the first enclosure portion and the second enclosure portion, at some point, the free end of the at least one latching element impinges on the lead-chamfer and is then displaced in the deflection direction upon a further movement of the first enclosure portion and the second enclosure portion towards each other along the assembly direction.

In a preferred embodiment, a base section of the at least one latching element is arranged at a ceiling section of the first enclosure portion. The ceiling section preferably faces into the assembly direction. The at least one latching element protrudes from the ceiling section in the assembly direction. Thereby, the at least one latching element, or at least a free end thereof, is deflectable in directions running perpendicularly to the assembly direction. Furthermore, forces acting along the assembly direction on the at least one latching element may be supported at the ceiling section while minimising the risk of kinking the at least one latching element.

In some embodiments, the at least one counter latching element is arranged at a wall section of the second enclosure portion. The wall section extends essentially in parallel to the assembly direction. The at least one counter latching element protrudes from the wall section. Any forces acting in or opposite to the assembly direction may be securely supported at the wall section via the at least one counter latching element.

In some embodiments, the blocking element is arranged at an opposite wall section and/or a side wall section of the second enclosure portion. The wall section and/or the side wall section preferably extend in parallel to the assembly direction. The blocking element protrudes from the opposite wall section in a direction opposite to the latching direction. Furthermore, the blocking element protrudes from the side wall section in the deflection direction. By connecting the blocking element both to the opposite wall section and the side wall section, the blocking element is stably held in position at the second enclosure portion. Any deflection of the blocking element is inhibited. Thus, the blocking element can reliably deflect the at least one latching element in the deflection direction and afterwards secure the at least one latching element against movements in a direction opposite to the latching direction after the fixation position has been reached.

In some embodiments, at least two of the wall section, the opposite wall section, and the side wall section together form a channel accommodating the at least one latching element and the at least one counter latching element in the fixation position. Preferably, in the fixation position, the at least one latching element and the at least one counter latching element are received within the channel in a manner that they are encapsulated within the enclosure assembly and thus protected against environmental impacts and in particular against tamper attempts. In the event that the enclosure has to be opened, for example for maintenance reasons, an opening for accessing the channel can be provided. The opening may be formed in a bottom of the second enclosure portion. A special tool may be inserted through the opening in order to disengage the at least one latching element and the at least one counter latching element.

In a preferred embodiment, each of the first enclosure portion and the second enclosure portion essentially forms a half of the enclosure. In other words, the first enclosure portion and the second enclosure portion may constitute a first enclosure half and a second enclosure half, respectively. In the fully assembled state, the two halves may essentially form the enclosure, and in particular an inner space thereof for accommodating the metering device. The present invention provides an easy and fast way to assemble an enclosure assembly and secure it in the fully assembled state by joining the halves through moving them towards each other along the assembly direction until reaching the fully assembled state.

BRIEF DESCRIPTION OF THE DRAWINGS

In order to describe the manner in which advantages and features of the disclosure can be obtained, in the following a more particular description of the principles briefly described above will be rendered by reference to specific embodiments thereof which are illustrated in the appended drawings. These drawings depict only exemplary embodiments of the present disclosure and are not therefore to be considered to be limiting of its scope.

DESCRIPTION

Figure 1:
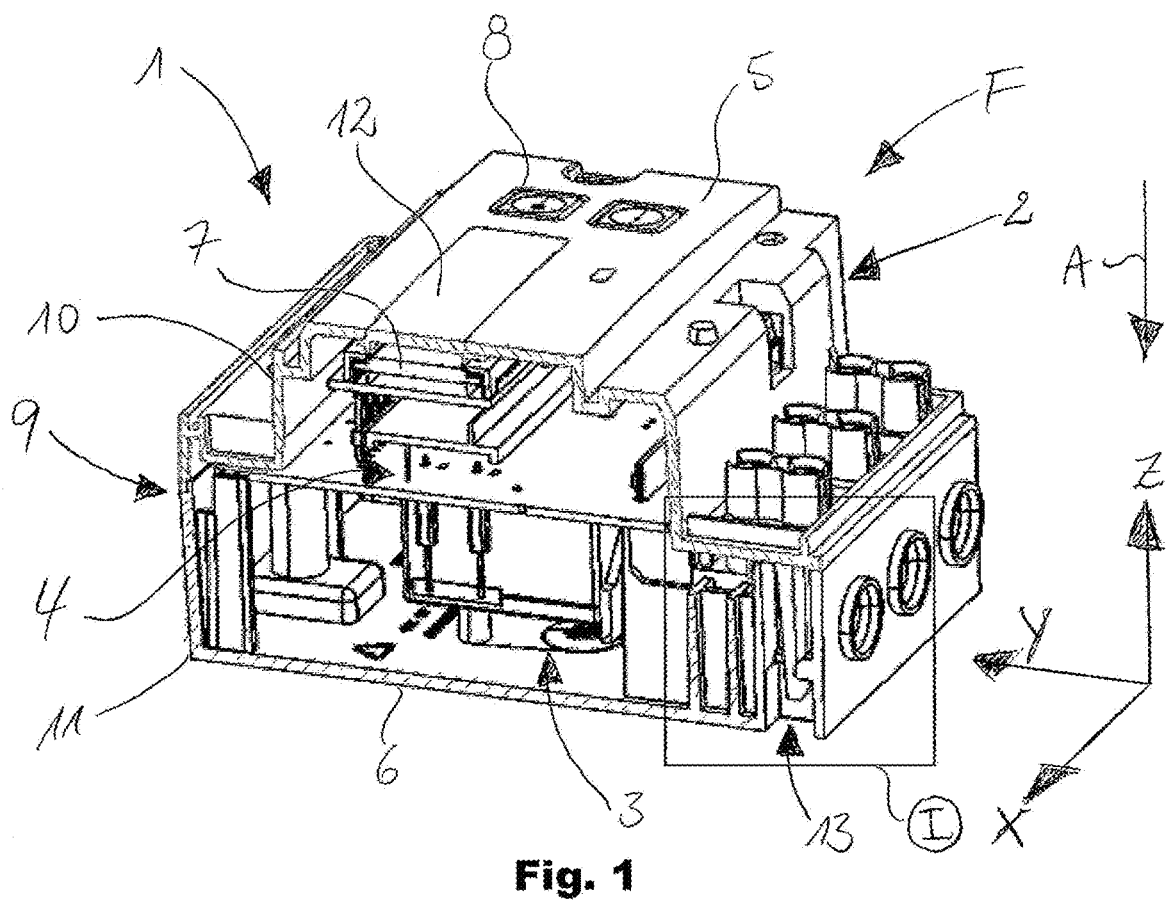
FIG. 1 Shows a schematic perspective cross-sectional view of a metering apparatus with an enclosure assembly according to an embodiment of the present invention in a fully assembled state.

FIG. 1 shows a metering apparatus 1 according to an embodiment of the present invention in a schematic perspective view. The metering apparatus 1 comprises an enclosure 2 providing an inner space 3 for accommodating a metering device 4. The metering apparatus extends in a longitudinal direction X, a transverse direction Y, and a height direction Z which together form a Cartesian coordinate system.

The enclosure 2 provides a front face 5 and a back side 6. A display 7 and controls 8 of the metering device 4 are arranged at the front face 5. The backside 6 is configured to be mounted to a support, such as a wall of an electric cabinet or building where the metering apparatus 1 is supposed to be installed. The enclosure 2 is assembled from an enclosure assembly 9 comprising a first enclosure portion 10 and a second enclosure portion 11. Furthermore, the enclosure assembly 9 may comprise transparent viewing panels 12 for reading and/or operating the display 7.

The first enclosure portion 10 and the second enclosure portion 11 are each formed as a half of the enclosure 2. They together constitute the inner space 3 and are provided with a fixation arrangement 13 for affixing the first enclosure portion 10 to the second enclosure portion 11 in a fully assembled state F of the enclosure assembly 9 shown in FIG. 1. In the fully assembled state F, the fixation arrangement 13 prevents the first enclosure portion 10 and the second enclosure portion 11 from being seperated from each other along an assembly direction A. The first enclosure portion 10 is configured to be assembled with the second enclosure portion 11 by moving the first enclosure portion 10 towards the second enclosure portion 11 in the assembly direction A, i.e. in a direction opposite to the height direction Z.

Figure 2:
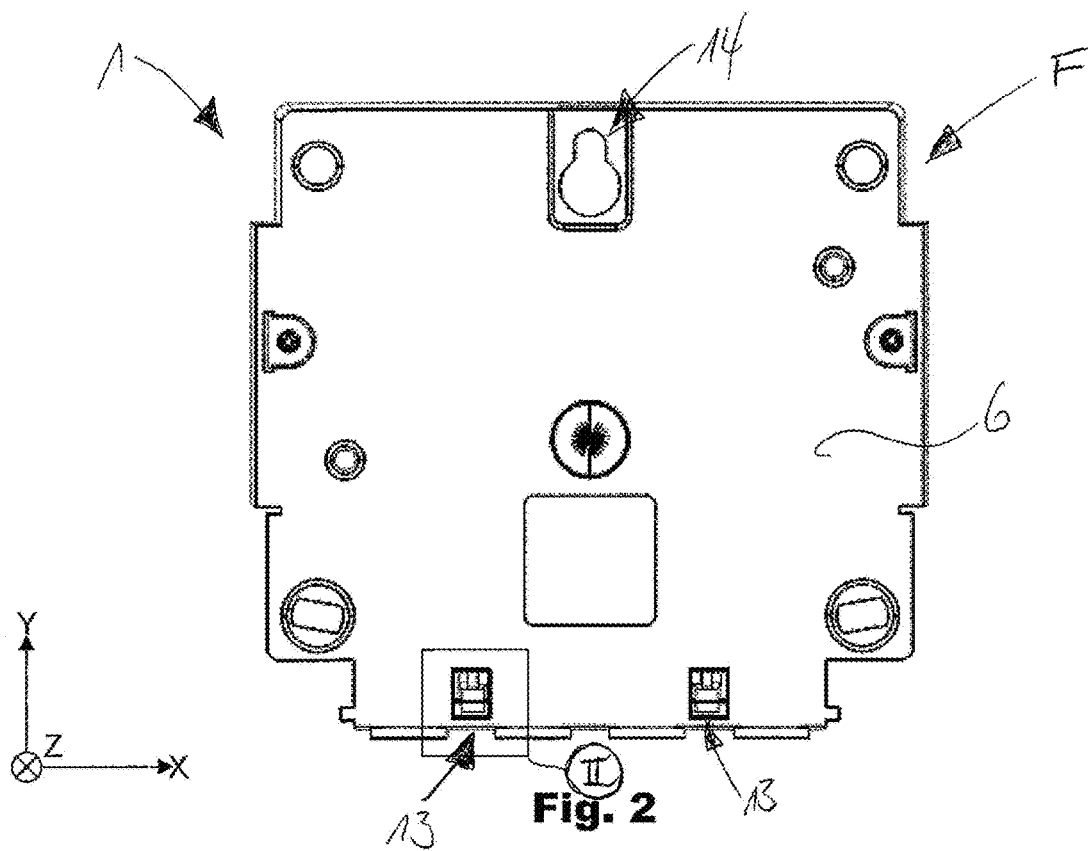
FIG. 2 shows a schematic bottom view of the enclosure assembly illustrated in FIG. 1.

FIG. 2 shows the metering apparatus 1 with the enclosure assembly 9 in the fully assembled state F in a schematic bottom view. Here it becomes apparent that the enclosure assembly 9 is provided with two fixation arrangement 13. The fixation arrangement 13 are accessible via the backside 6. Furthermore, at least one mounting means 14 is provided at the backside for mounting the metering apparatus 1 at a wall of an electric cabinet or building (not shown).

Figure 3:
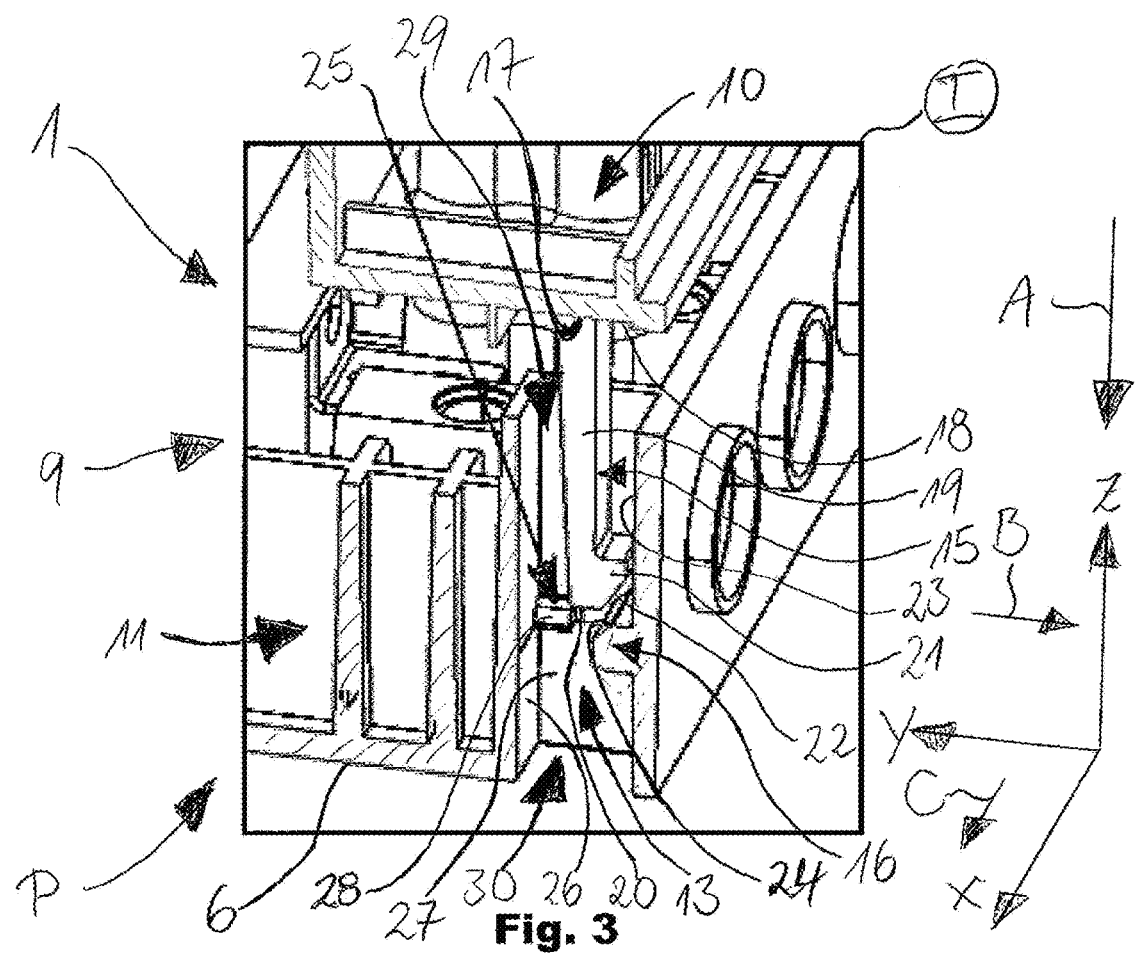
FIG. 3 shows a detail I depicted in FIG. 1 of the enclosure assembly in a pre-assembled state.

FIG. 3 shows a detail I depicted in FIG. 1 of the enclosure assembly 9 in a pre-assembled state P. The enclosure assembly 9 is illustrated in a schematic cross-sectional view cutting the fixation arrangement 13 along a plane extending in parallel to the transverse direction Y and the height direction Z. The fixation arrangement 13 comprises a latching element 15 and a counter latching element 16. The latching element 15 is formed at the first enclosure portion 10. The counter latching element 16 is formed at the second enclosure portion 11.

The latching element 15 has a root or base section 17 which is connected to a ceiling section 18 of the first enclosure portion 10. From the base section 17, a latching arm 19 of the latching element 15 extends downwardly in the assembly direction A. At a free end 20 of the latching element 15 pointing in the assembly direction A, the latching element 15 is provided with a latching nose 21 extending from the latching element 15 in a latching direction B running in parallel and opposite to the transverse direction Y and thus perpendicularly to the assembly direction A. The latching nose 21 is provided with a bevel 22 facing under an angle in the assembly direction A and the latching direction B.

The counter latching element 16 is formed as a detent protruding in a direction opposite to the latching direction B from a wall section 23 of the second enclosure portion 11. The counter latching element 16 is provided with a counter bevel 24 facing under an angle in a direction opposite to the assembly direction A and the latching direction B. The bevel 22 and the counter bevel 24 facilitate a deflection of the latching element 15, in particular the free end 20 thereof, in a direction opposite to the latching direction B when the latching nose 21 impinges on the counter latching element 16 when being moved further along the assembly direction A towards the counter latching element 16.

A blocking element 25 of the fixation arrangement 13 is provided at the second enclosure portion 11. The blocking element 25 is arranged at an opposite wall section 26 and a side wall section 27 of the second enclosure portion 11. The blocking element 25 extends from the opposite wall section 26 in the latching direction B, and from the side wall section 27 in a deflection direction C running in parallel to the longitudinal direction X and thus perpendicularly to the assembly direction A as well as to the latching direction B, respectively. A lead-in chamfer 28 formed at the blocking element 25 faces in the deflection direction C and in a direction opposite to the assembly direction A under an angle. The latching element 15, in particular the free end 20 thereof, is displaced in the deflection direction C when the free end 20 impinges on the blocking element 25 while being moved further along the assembly direction A towards the blocking element 25.

Furthermore, the wall section 23, the opposite wall section 26, and the side wall section 27 together form a channel 29 of the enclosure assembly 9, in particular of the fixation arrangement 13, by narrowly delimiting a space within the second enclosure portion 11 for receiving the latching element 15. At its top, the channel 29 is delimited by the ceiling 18 in the fully assembled state F. Towards the bottom, the channel 29 is accessible through an opening 30 formed in the backside 6 of the enclosure assembly 9.

Figure 4:
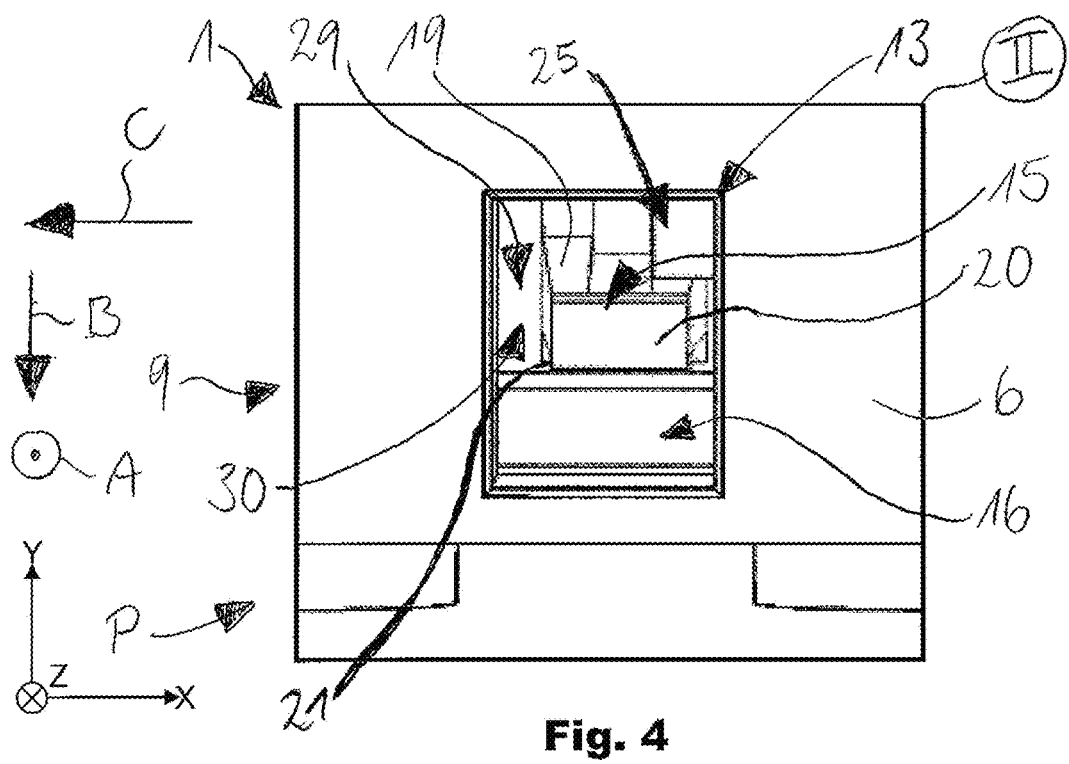
FIG. 4 shows a detail II depicted in FIG. 2 of the enclosure assembly in the pre-assembled state.

FIG. 4 shows a detail II depicted in FIG. 2 of the enclosure assembly 9 in the pre-assembled state P. The latching element 15, in particular the latching nose 21 overlaps with the counter latching element 16 in a projection along the assembly direction A, while along said projection, the latching element 15 is distanced from the blocking element 25. The blocking element 25, in particular a lower edge thereof is arranged essentially at the same height but an upper edge thereof slightly behind the counter latching element 16 in the assembly direction A. Thus, on its way along the assembly direction A, the latching element 15 is first deflected by the counter latching element 16 in a direction opposite to the latching direction A and thereby guided towards the blocking element 25, where it impinges afterwards and subsequently deflected in the deflection direction C.

Figure 5:
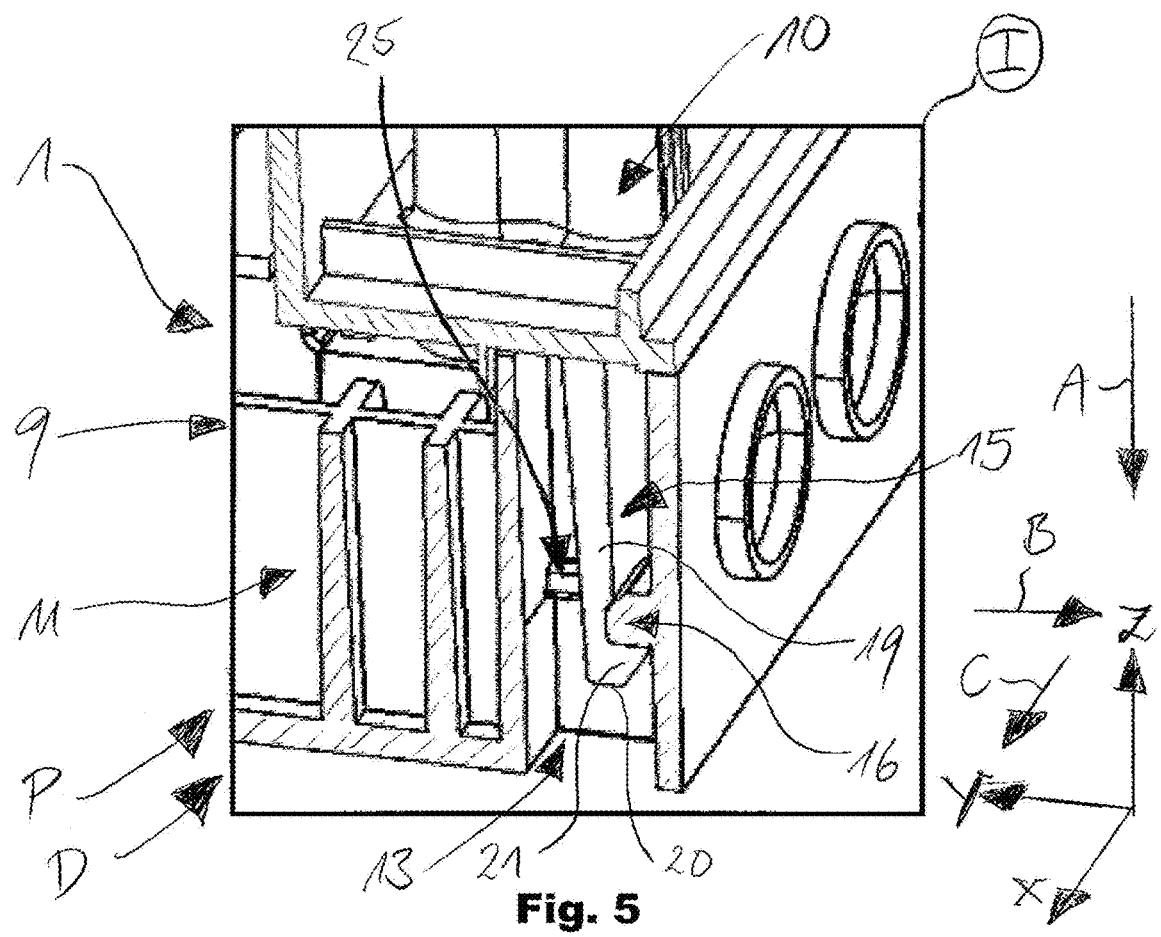
FIG. 5 shows the detail I depicted in FIG. 1 of the enclosure assembly in a latched state.
Figure 6:
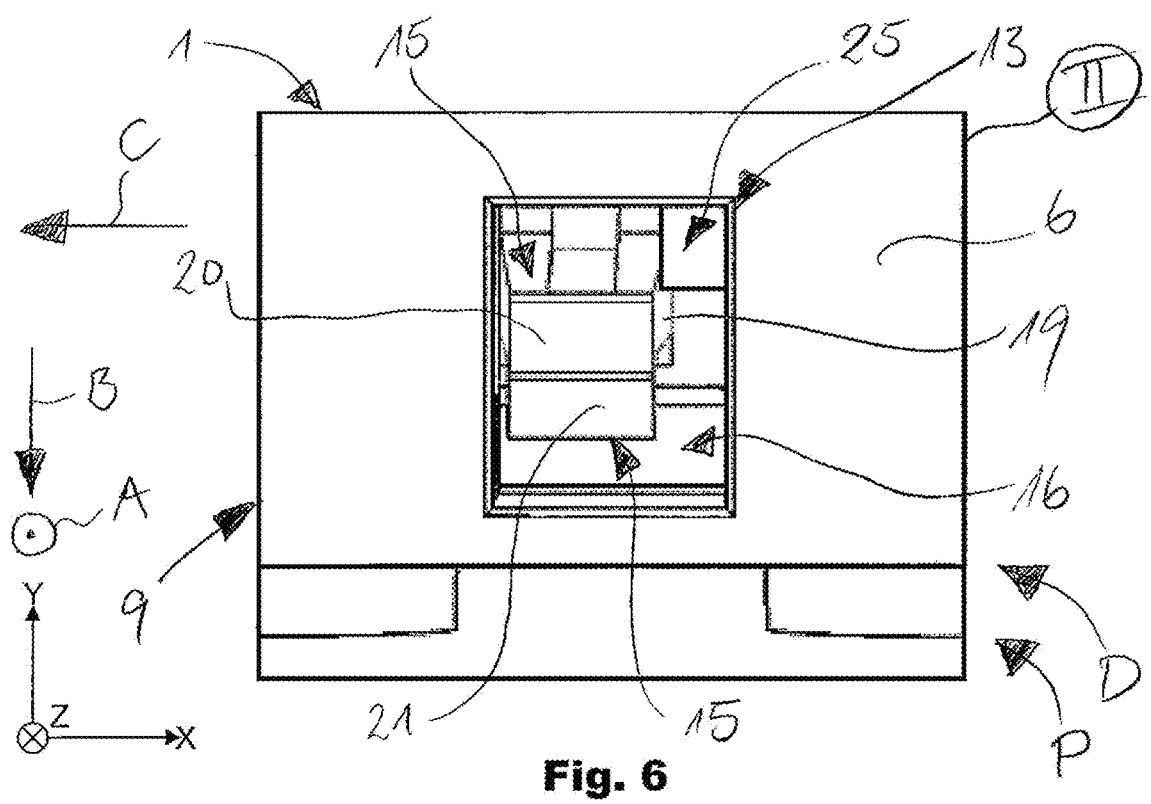
FIG. 6 shows the detail II depicted in FIG. 2 of the enclosure assembly in the latched state.

FIGS. 5 and 6 show the details I and II depicted in FIGS. 1 and 2, respectively, of the enclosure assembly 9 in a latched position D but still in the pre-assembled state P. In the latched position D, the latching nose 21 of the latching element 15 is moved past the counter latching element 16 in the assembly direction A. On its path past the counter latching element 16, the free end 20 of the latching element 15 has been deflected by the counter latching element 16 in a direction opposite to the latching direction B. After having passed the counter latching element 16 in the assembly direction A, the latching nose 21 has snapped back in the latching direction B from its deflected position and thus then overlaps with the counter latching element 16 and abuts the counter latching element 16 in a projection in a direction opposite to the assembly direction A. The latching element 15 and the counter latching element 16 are in engagement with each other. The first enclosure portion 10 is latched to the second enclosure portion 11 such that they are secured against being separated from each other along the assembly direction A.

Furthermore, in the latched position D and pre-assembled state P, the latching element 15, in particular the free end 20 with the latching nose 21, are deflected in the deflection direction C as the latching arm 19 laterally abuts the blocking element in a direction opposite to the deflection direction C. In other words, the latching element 15, in particular the latching arm 19 thereof, overlaps with the blocking element 25 in a projection in a direction opposite to the deflection direction C.

Figure 7:
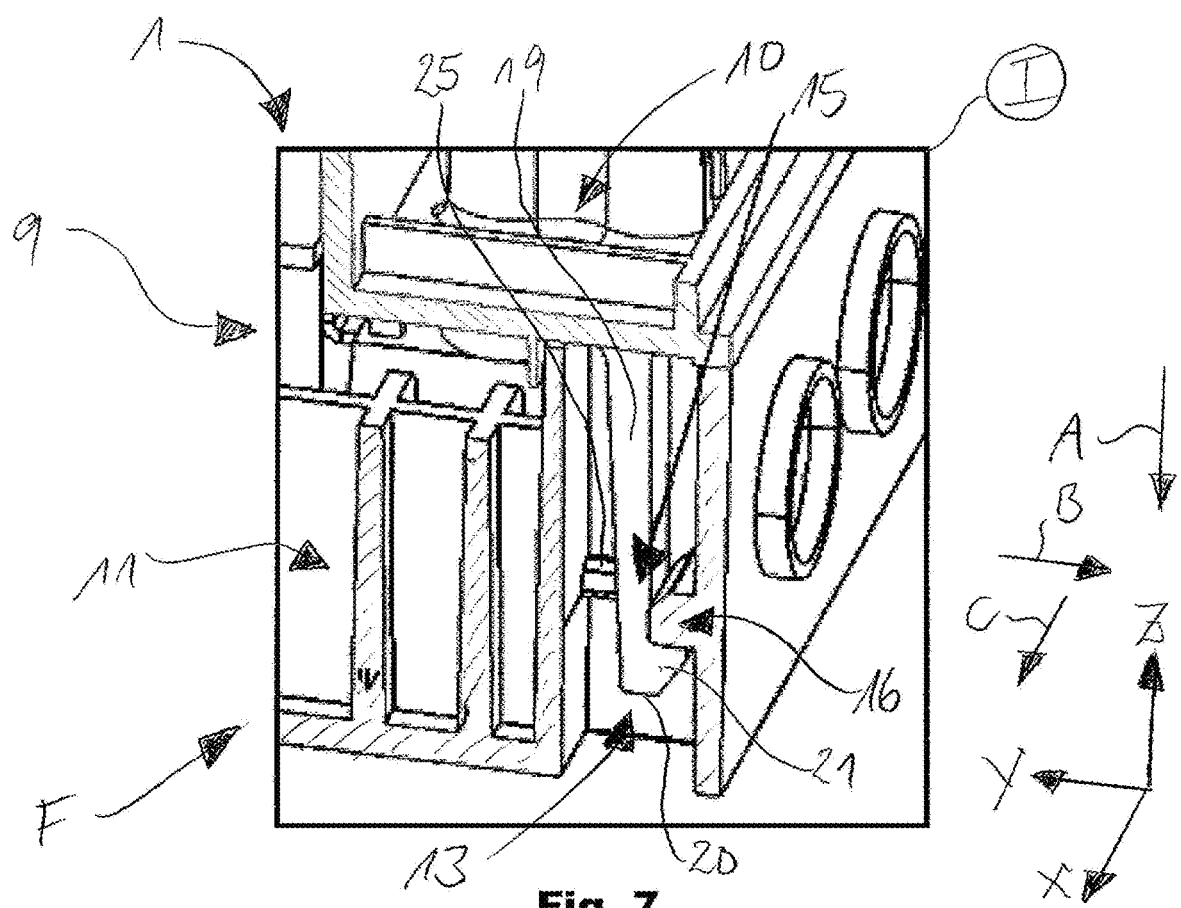
FIG. 7 shows the detail I depicted in FIG. 1 of the enclosure assembly in the fully assembled state.
Figure 8:
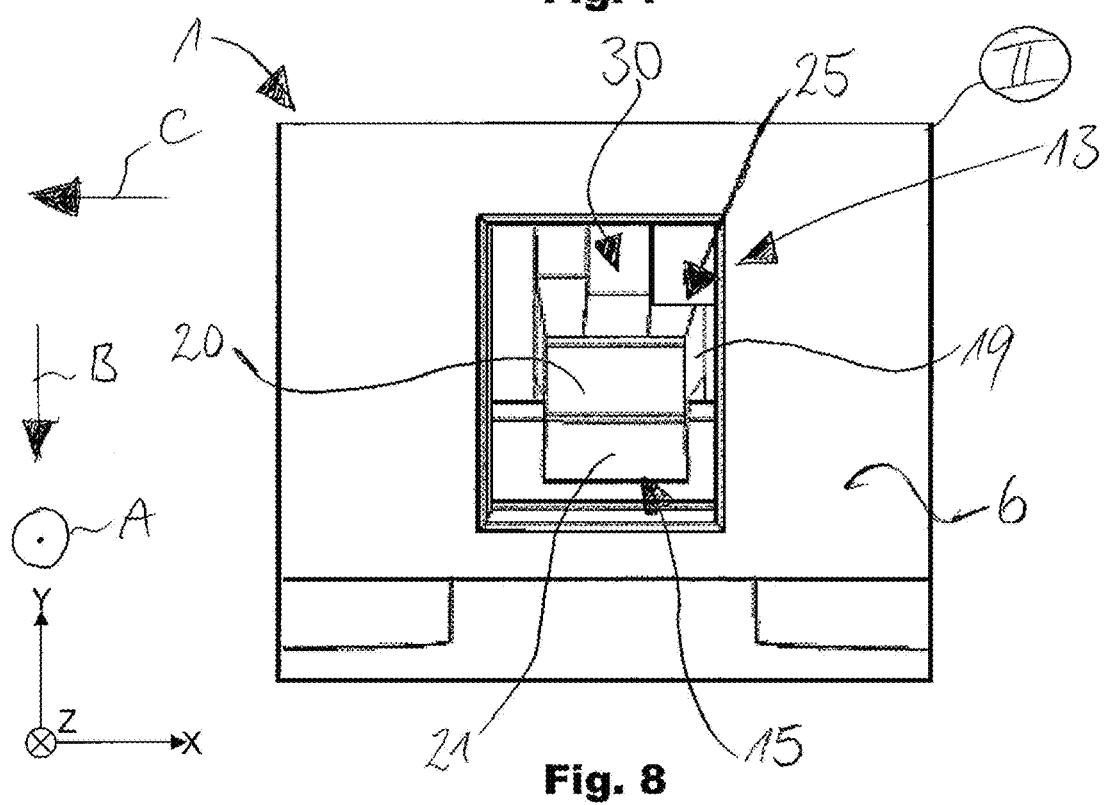
FIG. 8 shows the detail II depicted in FIG. 2 of the enclosure assembly in the fully assembled state.

FIGS. 7 and 8 show the details I and II depicted in FIGS. 1 and 2, respectively, of the enclosure assembly in the fully assembled state F. In the fully assembled state, the fixation arrangement 13 is in the latched position D and a blocked position E and thus in a fixation position S. In order to arrive at the fixation position S from the latched position D in the pre-assembled state P, the latching element 15, in particular the free end 20 with the latching nose 21 have snapped back in a direction opposite to the deflection direction C when being released from being deflected by the blocking element 25. The releasing motion can happen at the same moment when the latching element 15 snaps back in the latching direction B from being deflected by the counter latching element 16.

In the blocked position E, the blocking element 25 sits behind the latching element 15, in particular the latching arm 19 near the latching nose 21. Thus, the fixation arrangement 13 is secured in the fixation position S in that the latching element 15 is prevented from being deflected in a direction opposite to the latching direction B. Hence, the latching element 15 may not be easily disengaged from the counter latching element 16 and the first enclosure portion 10 is securely affixed to the second enclosure portion 11.

The latching element 15 may merely be released out of the blocked position E and latched position D by accessing the fixation arrangement 13 with a special tool through the opening 30 formed in the backside 6 of the enclosure assembly 9. However, as in operation, the metering apparatus 1 is normally attached to a wall of an electric cabinet or building by means of the mounting means 14 at the backside 6 of the second enclosure portion 11, the opening 30 is not accessible and hence the fixation arrangement 13 secured against tampering.

Deviations from the above-described embodiments are possible within the scope of the present invention. The metering apparatus 1 may comprise enclosures 2 providing inner spaces 3 for metering devices 4 and therefore be provided with front faces 5, backsides 6, displays 7 and/or controls 8 in whatever number and form and shape desired. The enclosure 2 may be provided as an enclosure assembly 9 with first enclosure portions 10, second enclosure portions 11 and viewing panels 12, comprising fixation arrangements 13, mounting means 14, latching elements 15, counter latching element 16, base sections 17, ceiling sections 18, latching arms 19, free ends 20, latching noses 21, bevels 22, wall sections 23, counter bevels 24, blocking elements 25, opposite wall sections 26, side wall sections 27, lead-in chamfers 28, channels 29 and/or openings 30 in whatever number form and shape required by a certain application.

REFERENCE NUMERALS 1 metering apparatus
2 enclosure
3 inner space
4 metering device
5 front face
6 backside
7 display
8 controls
9 enclosure assembly
10 first enclosure portion
11 second enclosure portion
12 viewing panel
13 fixation arrangement
14 mounting means
15 latching element
16 counter latching element
17 base section
18 ceiling section
19 latching arm
20 free end
21 latching nose
22 bevel
23 wall section
24 counter bevel
25 blocking element
26 opposite wall section
27 side wall section
28 lead-in chamfer
29 channel
30 opening
A assembly direction
B latching direction
C deflection direction
D latched position
E blocked position
F fully assembled state
P pre-assembled state
S fixation position
X longitudinal direction
Y transverse direction
Z height direction

The invention claimed is:

1. An enclosure assembly, comprising:
a first enclosure portion and a second enclosure portion which are configured to be assembled by being moved towards each other along an assembly direction, and in a fully assembled state of the enclosure assembly enclose at least a part of an inner space for accommodating a metering device; and
a fixation arrangement for affixing the first enclosure portion to the second enclosure portion in the fully assembled state, wherein the fixation arrangement in a fixation position prevents the first enclosure portion and the second enclosure portion from being separated from each other;
wherein the fixation arrangement comprises at least one latching element arranged at the first enclosure portion and at least one counter latching element arranged at the second enclosure portion;
wherein a latching nose is arranged at a free end of the at least one latching element and protrudes from the at least one latching element in a latching direction running perpendicularly to the assembly direction; and
wherein in the fixation position, the at least one latching element is in engagement with the at least one counter latching element, and
a blocking element prevents a disengagement of the at least one latching element and the at least one counter latching element,
wherein
in a deflected position of the at least one latching element, the latching nose abuts the at least one counter latching element in the latching direction, and the blocking element abuts the at least one latching element in a deflection direction running perpendicularly to the latching direction.

2. The enclosure assembly according to claim 1, wherein the latching element comprises a latching arm extending away from the first enclosure portion along the assembly direction.

3. The enclosure assembly according to claim 1, wherein in the fixation position, the at least one latching element is positioned between the at least one counter latching element and the blocking element.

4. The enclosure assembly according to claim 1, wherein the at least one counter latching element is formed as a detent jutting out in a direction opposite to the latching direction.

5. The enclosure assembly according to claim 1, wherein the blocking element is located behind the at least one latching element in the fixation position on an opposite side of the at least one latching element as the at least one counter latching element.

6. The enclosure assembly according to claim 1, wherein the at least one counter latching element and the blocking element are arranged essentially at a same height measured in parallel to the assembly direction.

7. The enclosure assembly according to claim 1, wherein the blocking element is formed as a notch with a lead-in chamfer at least partially facing in a direction opposite to the assembly direction.

8. The enclosure assembly according to claim 1, wherein a base section of the at least one latching element is arranged at a ceiling section of the first enclosure portion.

9. The enclosure assembly according to claim 1, wherein the at least one counter latching element is arranged at a wall section of the second enclosure portion.

10. The enclosure assembly according claim 1, wherein the blocking element is arranged at an opposite wall section and/or a side wall section of the second enclosure portion.

11. The enclosure assembly according to claim 9, wherein the blocking element is arranged at an opposite wall section and/or a side wall section of the second enclosure portion and at least two of the wall section, the opposite wall section, and the side wall section together form a channel accommodating the at least one latching element and the at least one counter latching element in the fixation position.

12. The enclosure assembly according to claim 1, wherein each of the first enclosure portion and the second enclosure portion essentially forms a half of the enclosure.

13. A metering apparatus comprising a metering device accommodated within an enclosure assembly, wherein the enclosure assembly comprises:
- a first enclosure portion and a second enclosure portion which are configured to be assembled by being moved towards each other along an assembly direction, and in a fully assembled state of the enclosure assembly enclose at least a part of an inner space for accommodating the metering device; and
- a fixation arrangement for affixing the first enclosure portion to the second enclosure portion in the fully assembled state, wherein the fixation arrangement in a fixation position prevents the first enclosure portion and the second enclosure portion from being separated from each other;

wherein the fixation arrangement comprises at least one latching element arranged at the first enclosure portion and at least one counter latching element arranged at the second enclosure portion;

wherein a latching nose is arranged at a free end of the at least one latching element and protrudes from the at least one latching element in a latching direction running perpendicularly to the assembly direction; and wherein in the fixation position, the at least one latching element is in engagement with the at least one counter latching element, and a blocking element prevents a disengagement of the at least one latching element and the at least one counter latching element, wherein in a deflected position of the at least one latching element, the latching nose abuts the at least one counter latching element in the latching direction, and the blocking element abuts the at least one latching element in a deflection direction running perpendicularly to the latching direction.

* * * * *